United States Patent
Lee

(10) Patent No.: US 9,997,229 B2
(45) Date of Patent: Jun. 12, 2018

(54) ADDRESS DECODER AND ACTIVE CONTROL CIRCUIT AND SEMICONDUCTOR MEMORY INCLUDING THE SAME

(71) Applicant: SK hynix Inc., Icheon-si, Gyeonggi-do (KR)

(72) Inventor: Hyun Sung Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/436,495

(22) Filed: Feb. 17, 2017

(65) Prior Publication Data

US 2018/0082737 A1  Mar. 22, 2018

(30) Foreign Application Priority Data

Sep. 20, 2016  (KR) .................. 10-2016-0120241

(51) Int. Cl.
 *G11C 7/00* (2006.01)
 *G11C 11/406* (2006.01)
 *G11C 11/408* (2006.01)
(52) U.S. Cl.
 CPC .... *G11C 11/40618* (2013.01); *G11C 11/4087* (2013.01)

(58) Field of Classification Search
 CPC .............. G11C 11/40618; G11C 11/4087
 USPC ............... 365/222, 230.03, 230.08
 See application file for complete search history.

(56) References Cited

U.S. PATENT DOCUMENTS

| | | | |
|---|---|---|---|
| 8,675,436 B2* | 3/2014 | Kim ............ | G11C 11/406 365/222 |
| 8,958,259 B2* | 2/2015 | Sakakibara ....... | G11C 11/40615 365/222 |
| 9,025,405 B2* | 5/2015 | Jeong .............. | G11C 11/402 365/149 |
| 9,685,219 B2* | 6/2017 | Shin ............. | G11C 11/40607 |
| 2016/0343423 A1* | 11/2016 | Shido ............ | G11C 11/4076 |

FOREIGN PATENT DOCUMENTS

KR  1020010047329 A  6/2001

* cited by examiner

*Primary Examiner* — Vu Le
(74) *Attorney, Agent, or Firm* — William Park & Associates Ltd.

(57) ABSTRACT

An address decoder includes decoding logic configured to generate a decoding address by decoding one of a first die ID having a value according to a first operation mode, a second die ID having a value according to a second operation mode, and a bank address according to a signal having different values in the first operation mode and the second operation mode.

16 Claims, 4 Drawing Sheets

ADDRESS DECODER AND ACTIVE CONTROL CIRCUIT AND SEMICONDUCTOR MEMORY INCLUDING THE SAME

CROSS-REFERENCES TO RELATED APPLICATION

The present application claims priority under 35 U.S.C. § 119(a) to Korean application number 10-2016-0120241, filed on Sep. 20, 2016, in the Korean Intellectual Property Office, which is incorporated herein by reference in its entirety as though fully set forth herein.

BACKGROUND

The present invention relates generally to a semiconductor circuit, and in particular to an address decoder, and an active control circuit, and a semiconductor memory including the same.

Semiconductor memory may include, for example, a high bandwidth memory (HBM), having a structure in which a plurality of dies are stacked and coupled through a through-electrode, and thus the number of input/output (I/O) units is increased and the bandwidth is increased.

The semiconductor memory may receive an address and a command in an integrated form from an exterior device through an address pin.

Since the semiconductor memory includes a plurality of stacked dies, there is a need for an address processing method for efficiently operating the plurality of stacked dies, by considering circuit area, signal processing timing margin, and the like.

SUMMARY

In an embodiment in accordance with the present invention, an address decoder may include a decoding logic configured to generate a decoding address by decoding one of a first die identification (ID) having a value according to a first operation mode, a second die ID having a value according to a second operation mode, and a bank address according to a signal having different values in the first operation mode and the second operation mode.

In accordance with another embodiment, an active control circuit may include: an address decoder configured to generate a decoding address by decoding one of a first die identification (ID) having a value according to a first operation mode, a second die ID having a value according to a second operation mode, and a bank address according to a signal having different values in the first operation mode and the second operation mode; a command decoder configured to generate a decoding command by decoding signal bits of an address signal assigned to a command; and an active control signal generation circuit configured to generate a plurality of active control signals according to an active command and a refresh command of the decoding command and the decoding address.

In yet a further embodiment in accordance with the present invention, a semiconductor memory may include: a base die; a plurality of core dies stacked over the base die, each including a plurality of memory banks; and an address decoder configured to generate a decoding address by decoding one of a first die identification (ID) having a value according to a first operation mode, a second die ID having a value according to a second operation mode, and a bank address according to a signal having different values in the first operation mode and the second operation mode.

BRIEF DESCRIPTION OF THE DRAWINGS

The above and other features and advantages of the present invention will become readily apparent by reference to the following detailed description when considered in conjunction with the accompanying drawings, in which.

DETAILED DESCRIPTION

Hereinafter, embodiments in accordance with the present invention will be explained in more detail with reference to the accompanying drawings. Although the present invention is described with reference to a number of example embodiments thereof, it should be understood that numerous other modifications and variations may be devised by one skilled in the art that will fall within the spirit and scope of the invention.

A memory system 100 according to an embodiment may be implemented in the form of system in package (SIP), multichip package (MCP), or system on chip (SOC), or in the form of package on package (POP), including a plurality of packages.

Figure 1:
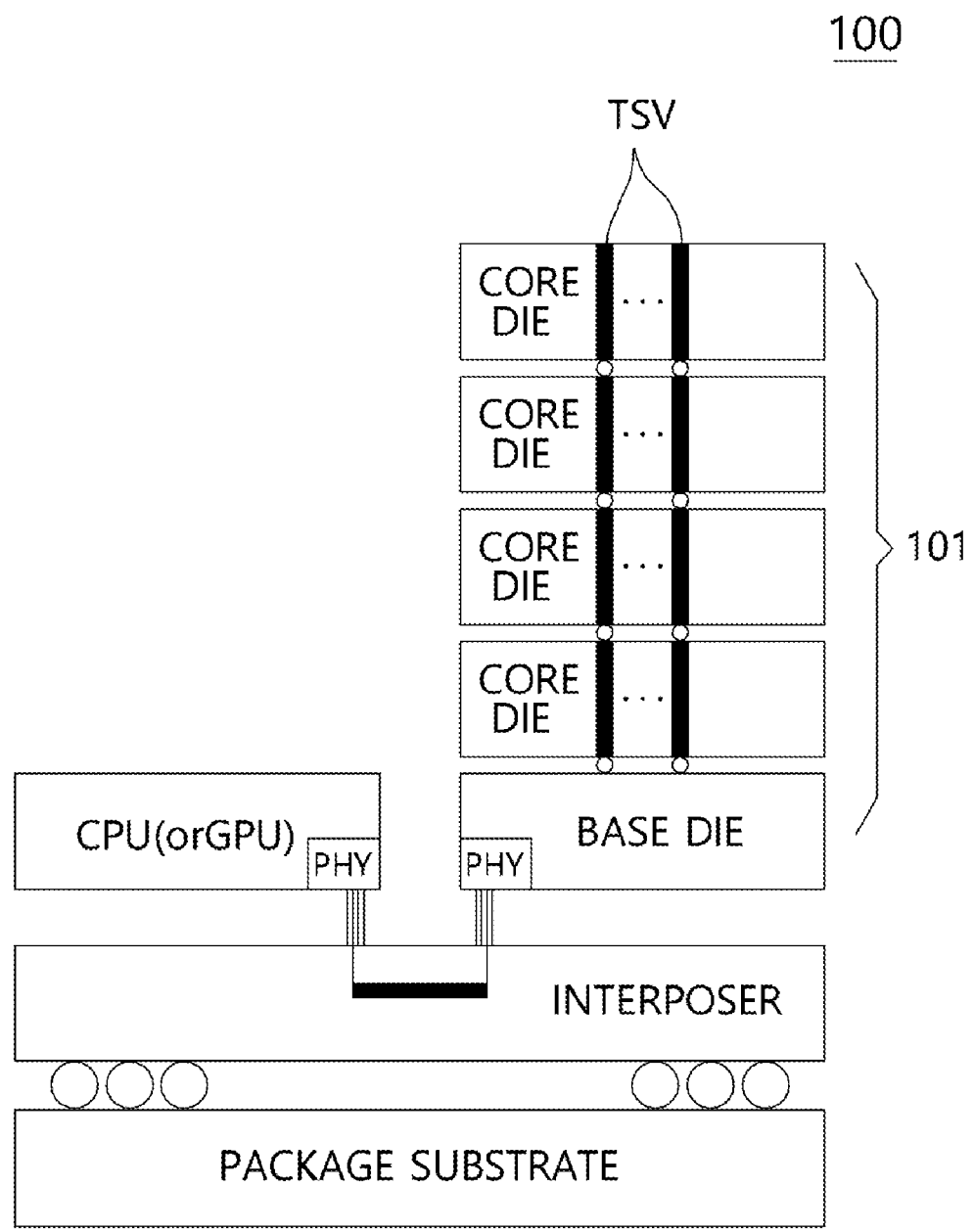
FIG. 1 is a diagram illustrating a configuration of a memory system in an embodiment in accordance with the present invention.

As illustrated in FIG. 1, the memory system 100 according to an embodiment may include a stacking semiconductor memory 101, a memory controller (for example, central processing unit (CPU) or graphic processing unit (GPU)), an interposer, and a package substrate.

The stacking semiconductor memory 101 may be configured in a high bandwidth memory (HBM) form, having a structure in which a plurality of dies are stacked and coupled through a through-electrode, and thus the number of input/output (I/O) units is increased and the bandwidth is increased.

The interposer may be disposed over, and coupled to, the package substrate.

The stacking semiconductor memory 101 and the memory controller (CPU or GPU) may be disposed over, and coupled to, the interposer.

Physical regions PHY of the stacking semiconductor memory 101 and the memory controller (CPU or GPU) may be coupled through the interposer.

The stacking semiconductor memory 101 may comprise a plurality of stacked dies.

Figure 2:
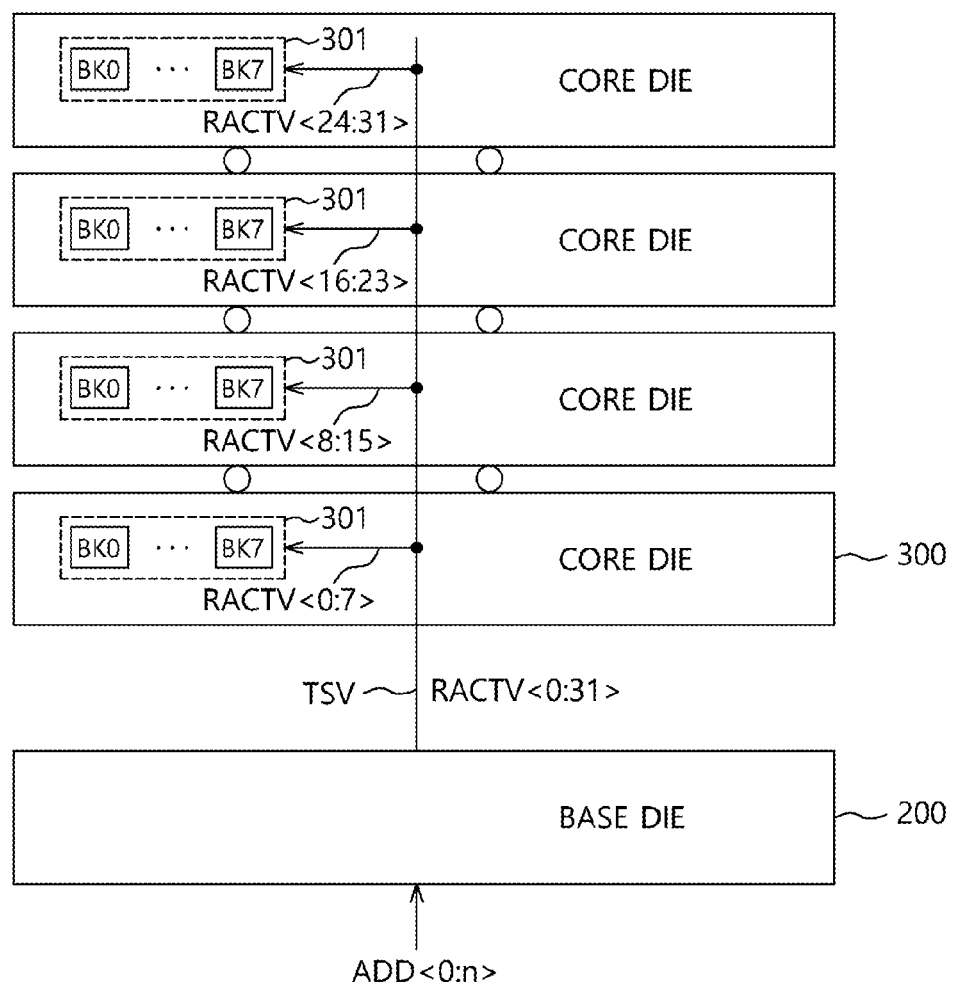
FIG. 2 is a diagram illustrating an active control signal transmission method of a core die and a base die of FIG. 1.

As illustrated in FIG. 2, the plurality of dies may include a base die 200 and a plurality of core dies 300.

The base die 200 and the plurality of core dies 300 may be electrically coupled through a plurality of through-electrodes, for example, through silicon vias (TSVs).

As illustrated in FIG. 2, the base die 200 may generate a plurality of active control signals RACTV<0:31> according to an address signal ADD<0:n> input through address pins (not shown).

The plurality of active control signals RACTV<0:31> may be divided into active control signal sets RACTV<0:7>, RACTV<8:15>, RACTV<16:23>, and RACTV<24:31> which are provided to the plurality of core dies 300.

The plurality of active control signals RACTV<0:31> may be provided to the plurality of core dies 300 through the plurality of through-electrodes or TSVs.

Each of the plurality of core dies 300 may include a memory block array 301.

The memory block array 301 may include a plurality of memory banks BK0 to BK7.

The plurality of memory banks BK0 to BK7 in each of the plurality of core dies 300 may be selectively activated according to a corresponding active control signal set among the active control signal sets RACTV<0:7>, RACTV<8:15>, RACTV<16:23>, and RACTV<24:31> which are provided to the plurality of core dies 300.

Figure 3:
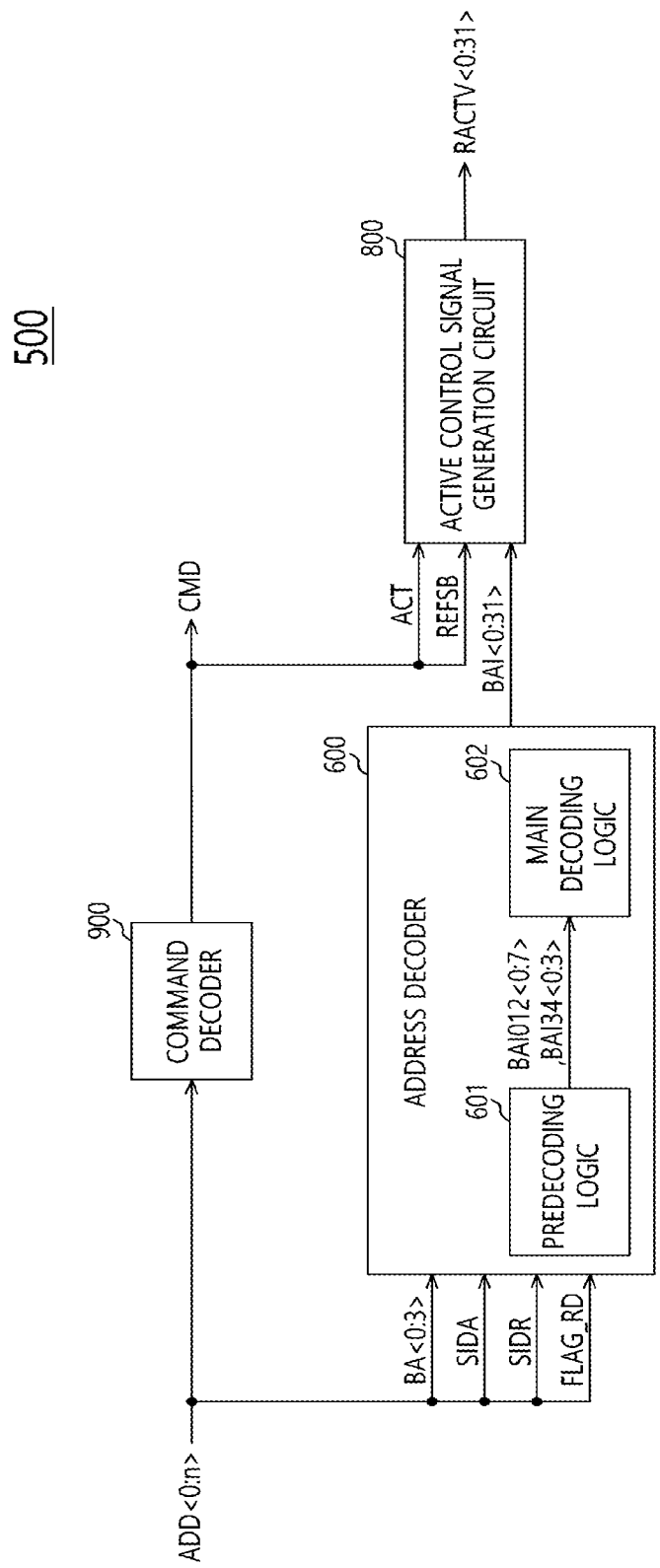
FIG. 3 is a diagram illustrating a configuration of an active control circuit in an embodiment in accordance with the present invention.

The base die 200 of FIG. 2 may include an active control circuit 500 as illustrated in FIG. 3.

The active control circuit 500 may generate the plurality of active control signals RACTV<0:31> according to the address signal ADD<0:n>.

As illustrated in FIG. 3, the active control circuit 500 may include an address decoder 600, a command decoder 900, and an active control signal generation circuit 800.

The command decoder 900 may generate a decoding command CMD by decoding signal bits of the address signal ADD<0:n> assigned to a command.

The decoding command CMD may include an active command ACT and a refresh command REFSB.

The active control signal generation circuit 800 may generate the plurality of active control signals RACTV<0:31> according to the active command ACT, the refresh command REFSB, and a decoding address BAI<0:31>.

The address decoder 600 may generate the decoding address BAI<0:31> by decoding a bank address BA<0:3>, a first die identification (ID) SIDA, a second die ID SIDR, and a read flag FLAG_RD.

The address signal ADD<0:n> may include signal bits related to an address for selectively activating the memory block arrays 301 of the plurality of core dies 300 of FIG. 2, and signal bits related to various commands such as read, write, active, refresh, and precharge.

For example, portions of pins for transmitting the address signal ADD<0:n> may be assigned to the command and the other portions may be assigned to the address.

The address signal ADD<0:n> may include, for example, the bank address BA<0:3>, the first die ID SIDA, the second die ID SIDR, and the read flag FLAG_RD.

The bank address BA<0:3> may be a signal for selecting any one of the plurality of memory banks BK0 to BK7.

In the address standard, the first die ID SIDA may refer to an address for a first operation mode, for example, a normal active operation, and the second die ID SIDR may be refer to an address for a second operation mode, for example, a refresh operation including a single bank refresh operation.

For example, a memory back for the normal active operation may be different from a memory bank for the refresh operation. In this example, the first die ID SIDA may have a different value from the second die ID SIDR.

Accordingly, it may be necessary to separately configure a decoder configured to decode the bank address BA<0:3> and the first die ID SIDA, and a decoder configured to decode the bank address BA<0:3> and the second die ID SIDR.

However, in an embodiment, the address decoder 600 may be configured in an integrated form which selects one of the first die ID SIDA and the second die ID SIDR, which is suitable for a current operation mode (normal active mode/refresh mode), and decodes the selected die ID and the bank address BA<0:3>. Because the signals to be decoded are all available at approximately the same time, and because of the high-speed decoding logic, the decoding operations occur at substantially the same time.

For example, the read flag FLAG_RD may be transitioned to logic high when the current operation mode is the normal active mode, and may be maintained at a logic low when the current operation mode is the refresh mode.

In an embodiment, the address decoder 600 may be configured to perform a decoding operation selectively using the first die ID SIDA, and the second die ID SIDR, based on the read flag FLAG_RD having different values according to the operation mode (normal active mode/refresh mode).

The address decoder 600 may include a predecoding logic 601 and a main decoding logic 602.

The predecoding logic 601 may generate predecoding addresses BAI012<0:7> and BAI34<0:3> by predecoding the bank address BA<0:3>, the first die ID SIDA, the second die ID SIDR, and the read flag FLAG_RD.

The main decoding logic 602 may generate the decoding address BAI<0:31> by decoding the predecoding addresses BAI012<0:7> and BAI34<0:3>.

Figure 4:
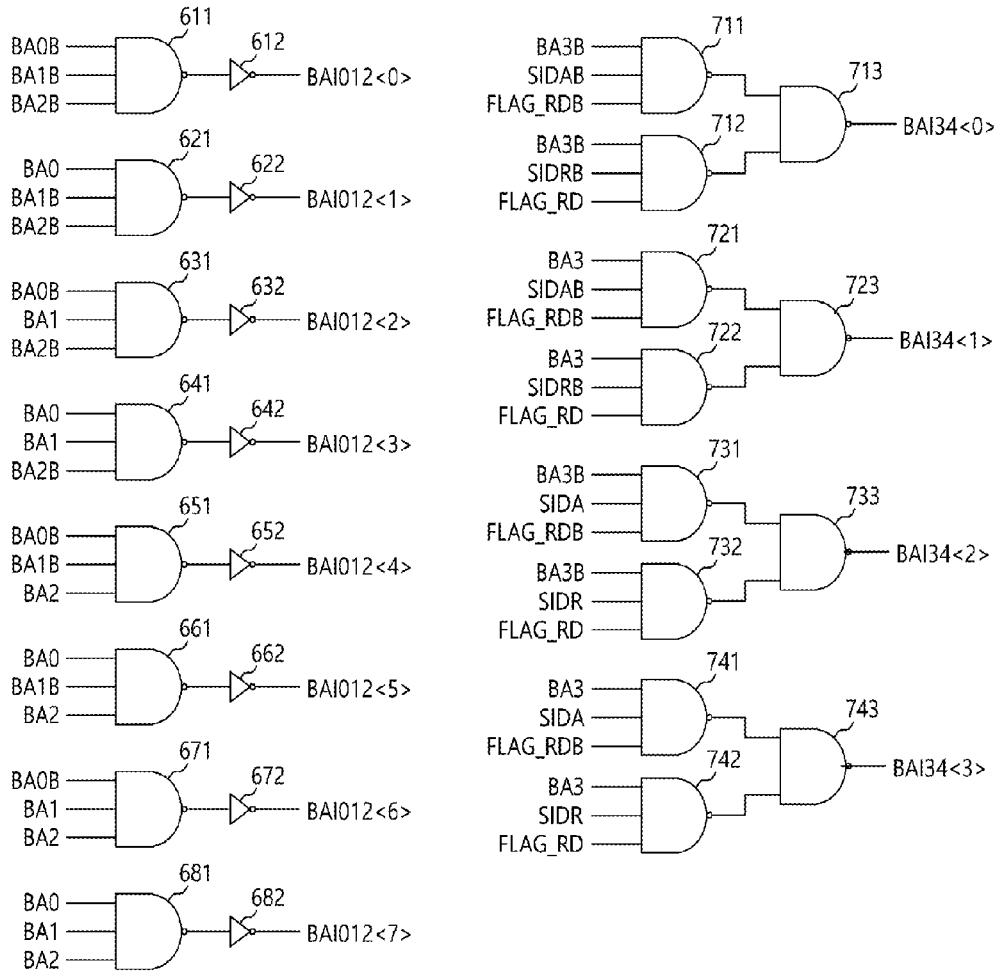
FIG. 4 is a diagram illustrating a configuration of a predecoding logic of FIG. 3.

As illustrated in FIG. 4, the predecoding logic 601 may include a plurality of logic gates 611 to 743.

A first logic gate array 611 to 682 may generate the predecoding address BAI012<0:7> of the predecoding addresses BAI012<0:7> and BAI34<0:3> by performing logical AND operations on combinations of the bank address BA<0:2>, for example, BA0, BA1, and BA2, and an inverting bank address BAB<0:2>, for example, BA0B, BA1B, and BA2B.

The second logic gate array 711-743 may generate the predecoding address BAI34<0:3> of the predecoding addresses BAI012<0:7> and BAI34<0:3> by performing primary logical NAND operations on combinations of the bank address BA3 and an inverting bank address BA3B, the first die ID SIDA and an inverting signal SIDAB, the second die ID SIDR and an inverting signal SIDRB, and the read flag FLAG_RD and an inverting signal FLAG_RDB, and performing secondary logical NAND operations on combinations of primary logical NAND operation results.

Figure 5:
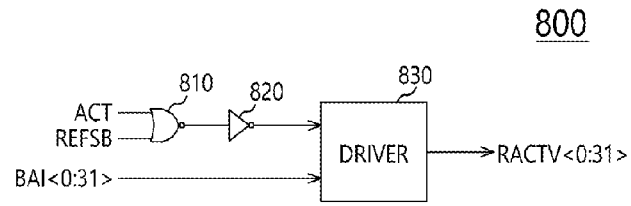
FIG. 5 is a diagram illustrating a configuration of an active control signal generation circuit of FIG. 3.

As illustrated in FIG. 5, the active control signal generation circuit 800 may include a first logic gate 810, a second logic gate 820, and a driver 830.

The first and second logic gates 810 and 820 may perform a logical OR operation on the active command ACT and the refresh command REFSB and output a logical OR operation result.

The driver 830 may output the plurality of active control signals RACTV<0:31> by driving the decoding address BAI<0:31> according to an output of the second logic gate 820.

The driver 830 may output the plurality of active control signals RACTV<0:31> by driving the decoding address BAI<0:31> when the output of the second logic gate 820 is, for example, logic high, that is, when any one of the active command ACT and the refresh command REFSB is activated.

In an embodiment, the address decoder may perform a decoding operation selectively using the first die ID SIDA and the second die ID SIDR based on the read flag FLAG_RD having different values according to the operation mode (normal active mode/refresh mode).

Different memory banks may be activated according to the operation mode (normal active mode/refresh mode) based on the plurality of active control signals RACTV<0:31>.

Referring to FIG. 2, when the current operation mode is the normal active mode, a first bank BK0 of the uppermost core die on the basis of the base die 200 may be activated according to the plurality of active control signals RACTV<0:31>.

When the current operation mode is the single refresh mode, an eighth bank BK7 of a core die adjacent to the base die 200 may be activated according to the plurality of active control signals RACTV<0:31>. The refresh operation may then be performed.

While certain embodiments have been described above, it will be understood by those skilled in the art that the embodiments described are by way of example only. Accordingly, the address decoder and active control circuits described herein should not be limited based on the described embodiments. Rather, the address decoder and active control circuits described herein should only be limited in light of the claims that follow, when taken in conjunction with the above description and accompanying drawings.

What is claimed is:

1. An address decoder comprising:
 a decoding logic configured to generate a decoding address by decoding a bank address and one of a first die identification (ID) having a value according to a first operation mode and a second die ID having a value according to a second operation mode, according to a signal having different values in the first operation mode and the second operation mode.

2. The address decoder of claim 1, wherein the first operation mode includes a normal active operation and the second operation mode includes a refresh operation.

3. The address decoder of claim 1, wherein a signal bit of an address signal related to a read command is used as the signal for selecting the first operation mode or the second operation mode.

4. The address decoder of claim 1, wherein the decoding logic includes:
 a predecoding logic configured to generate a predecoding address by decoding a portion of the bank address in accordance with a first predetermined combination, and decoding a remaining portion of the bank address, the first die ID, the second die ID, and the signal having the different values in the first operation mode and the second operation mode in accordance with a second predetermined combination; and
 a main decoding logic configured to generate the decoding address by decoding the predecoding address.

5. An active control circuit comprising:
 an address decoder configured to generate a decoding address by decoding one of a first die identification (ID) having a value according to a first operation mode, a second die ID having a value according to a second operation mode, and a bank address according to a signal having different values in the first operation mode and the second operation mode;
 a command decoder configured to generate a decoding command by decoding signal bits of an address signal assigned to a command; and
 an active control signal generation circuit configured to generate a plurality of active control signals according to an active command and a refresh command of the decoding command and the decoding address.

6. The active control circuit of claim 5, wherein the first operation mode includes a normal active operation, and the second operation mode includes a refresh operation.

7. The active control circuit of claim 5, wherein a signal bit of the address signal related to a read command is used as the signal for selecting the first operation mode or the second operation mode.

8. The active control circuit of claim 5, wherein the address decoder includes:
 a predecoding logic configured to generate a predecoding address by decoding a portion of the bank address in accordance with a first predetermined combination, and decoding a remaining portion of the bank address, the first die ID, the second die ID, and the signal having the different values in the first operation mode and the second operation mode in accordance with a second predetermined combination; and
 a main decoding logic configured to generate the decoding address by decoding the predecoding address.

9. A semiconductor memory comprising:
 a base die;
 a plurality of core dies stacked over the base die, each including a plurality of memory banks; and
 an address decoder configured to generate a decoding address by decoding a bank address and one of a first die identification (ID), having a value according to a first operation mode, and a second die ID having a value according to a second operation mode, according to a signal having different values in the first operation mode and the second operation mode.

10. The semiconductor memory of claim 9, wherein the first operation mode includes a normal active operation and the second operation mode includes a refresh operation.

11. The semiconductor memory of claim 9, wherein a signal bit of an address signal related to a read command is used as the signal for dividing the first operation mode and the second operation mode.

12. The semiconductor memory of claim 9, wherein the address decoder includes:
 a predecoding logic configured to generate a predecoding address by decoding a portion of the bank address in accordance with a first predetermined combination, and decoding a remaining portion of the bank address, the first die ID, the second die ID, and the signal having the different values in the first operation mode and the second operation mode in accordance with a second predetermined combination; and
 a main decoding logic configured to generate the decoding address by decoding the predecoding address.

13. The semiconductor memory of claim 9, wherein the address decoder is included in the base die.

14. The semiconductor memory of claim 9, further comprising an active control signal generation circuit configured to generate a plurality of active control signals according to an active command, a refresh command, and the decoding address.

15. The semiconductor memory of claim 14, wherein the plurality of active control signals are divided into active control signal sets which are provided to the plurality of core dies.

16. The semiconductor memory of claim 14, wherein the active control signal generation circuit is included in the base die.

* * * * *